US006732317B1

(12) United States Patent
Lo (10) Patent No.: US 6,732,317 B1
(45) Date of Patent: May 4, 2004

(54) APPARATUS AND METHOD FOR APPLYING MULTIPLE CRC GENERATORS TO CRC CALCULATION

(75) Inventor: John M. Lo, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 500 days.

(21) Appl. No.: 09/695,619

(22) Filed: Oct. 23, 2000

(51) Int. Cl.[7] ............................................. H03M 13/00
(52) U.S. Cl. ..................... 714/757; 714/758; 714/781; 714/782; 714/783; 714/784
(58) Field of Search ................................. 714/755, 756, 714/757, 758, 781, 782, 783, 784

(56) References Cited

U.S. PATENT DOCUMENTS

| | | | | |
|---|---|---|---|---|
| 3,678,469 A | * | 7/1972 | Freeman et al. ............. | 714/779 |
| 3,982,226 A | * | 9/1976 | Bunker et al. ............... | 714/758 |
| 4,593,393 A | * | 6/1986 | Mead et al. ................. | 714/757 |
| 4,720,830 A | | 1/1988 | Joshi et al. | |
| 5,375,127 A | * | 12/1994 | Leak et al. .................. | 714/772 |
| 5,757,826 A | * | 5/1998 | Fredrickson ................. | 714/784 |

OTHER PUBLICATIONS

Document No.: NN78102058, Parallel Programmable Array Structured CRC Generator, IBM Technical Disclosure Bulletin, vol. No.: 21, Issue No.: 5, p. No.: 2058–2059, Oct. 1, 1978.*
International Search Report, Application No. PCT/US 01/51347, mailed Mar. 6, 2003.
Joshi, S.M. et al. "A New Parallel Algorithm for CRC Generation", 2000 IEEE International Conference on Communications, Jun. 18–22, 2000, pp. 1764–1768.
Hobson, R. F. et al. "A High–Performance CMOS 32–Bit Parallel CRC Engine", IEEE Journal of Solid–State Circuits, vol. 34, No. 2, Feb. 1999, pp. 233–235.
Tong–BI Pei et al., "High–Speed Parallel CRC Circuits in VLSI", IEEE Transactions on Communications, vol. 40, No. 4, Apr. 1, 1992, pp. 653–657.
Albertengo, G. et al. "Parallel CRC Generation", IEEE Micro, vol. 10, No. 5, Oct. 1, 1990, pp. 63–71.
William Sinnema, Digital, Analog and Data Communication, Second Edition, pp. 424–437, A Reston Book, Prentice—Hall, Inc. Englewood Cliffs, New Jersey 07632.
Aram Perez, Byte—wise CRC Calculations, pp. 40–50, IEEE Micro, 1983.
R.J. Glaise, A two–step computation of cyclic redundancy code CRC–32 for ATM Networks, pp. 705–709, vol. 41, No. 6, Nov. 1997, IBM J. Res. Develop.
R.J. Glaise and X. Jacquart, Fast CRC Calculation, pp. 602–605, IEEE 1993.

\* cited by examiner

*Primary Examiner*—Albert Decady
*Assistant Examiner*—Joseph D. Torres
(74) *Attorney, Agent, or Firm*—Meyertons Hood Kivlin Kowert & Goetzel, P.C.; B. Noël Kivlin (57) ABSTRACT

An apparatus and method for generating a cyclic redundancy code with multiple cyclic redundancy code circuits are disclosed. High throughput data protocols can work more robustly if accompanied by high throughput error checking to verify the integrity of the communicated data. One approach of improving the performance of cyclic redundancy code generation hardware that can save money and development time is to combine multiple cyclic redundancy code circuits to perform the error checking. Data received is processed across the multiple cyclic redundancy code circuits. Future cyclic redundancy code circuits can also be combined according to this approach.

18 Claims, 6 Drawing Sheets

APPARATUS AND METHOD FOR APPLYING MULTIPLE CRC GENERATORS TO CRC CALCULATION

FIELD

The field includes routers, switches, modems, and generally hardware that sends and/or receives data. More particularly, this pertains to cyclic redundancy code (CRC) calculation to detect errors in data communication.

BACKGROUND

When data communication occurs, some data may be corrupted en route from the sender to the receiver. A reliable implementation of error detection may inform the receiver of the garbled state of a message, and allow the receiver to request a retransmission of the garbled data. Robust error detection thus improves the versatility of data transfers between units on a network, such as routers and switches, and units in a computer.

One error-detecting code is the CRC. In CRC, data in the message may be considered as a message poylnomial $M(x)$, with the bits of the data being the coefficients of $M(x)$. The CRC bits of the message are generated by dividing $M(x)$ by a cyclic redundancy code equation, or a generator polynomial $G(x)$. The quotient polynomial $Q(x)$ is discarded and the coefficients of the remainder polynomial $R(x)$ are appended to $M(x)$ before transmission by the sender of $M(x)+R(x)$. After reception, the receiver divides $M(x)+R(x)$ by $G(x)$. If the data transmission is error free, the new remainder is zero. A non-zero new remainder indicates that an error occurred in the transmission. The above CRC implementation is illustrative; other CRC implementations can be applied.

As data transmission speeds increase, the CRC hardware may need to generate the CRC faster. For example, upcoming standards such as 10 Gigabit Ethernet standard, being formalized as part of the IEEE 802.3ae standard, and the InfiniBand Architecture Specification, currently embodied in the Mar. 31, 2000 Release 0.9, present a need for high performance CRC hardware. One approach to generate CRC data faster is to start from the ground up, such as a new transistor layout, extensive testing associated with a next-generation design, etc. This approach can be time-consuming and expensive. Thus, it would be desirable to combine CRC hardware to handle faster data transmission. In the event a ground up approach was taken, it would be desirable to combine new CRC hardware to handle even faster data transmission.

SUMMARY

To overcome the limitations described above, and to overcome other limitations that will become apparent upon reading and understanding the present specification, the present invention discloses an apparatus using multiple cyclic redundancy code circuits to generate a cyclic redundancy code for a message. The generated cyclic redundancy code may be combined with the message and transmitted, or compared with an incoming message to detect errors.

A wide data stream representing a message can be divided into multiple narrower data streams, for example by interleaving. Each of the cyclic redundancy code circuits can have a message data input receiving one of the narrower data streams, and a cyclic redundancy code input. Each cyclic redundancy code circuit may generate an intermediate cyclic redundancy code after processing a previously generated cyclic redundancy code received from the cyclic redundancy code input and/or a part of the message data received from the message data input.

The cyclic redundancy code generator can be incorporated into any data device, such as a computer, a router, a network interface card, etc. The incorporated cyclic redundancy code generator may process data traffic internal to the data device, and/or communicated with another data device.

Some method embodiments generate the cyclic redundancy code for a message through generating intermediate cyclic redundancy codes, and/or dividing a message into multiple message streams. Another method embodiment assembles a cyclic redundancy code generator by coupling multiple cyclic redundancy code circuits.

Embodiments may combine cyclic redundancy code hardware based on a presently existing polynomial, thus preserving compatibility with legacy systems. For example, hardware may be developed that processes incoming data more than one byte at a time using the present generating polynomial. Embodiments may also combine cyclic redundancy code hardware based on a different polynomial, such as a newer polynomial.

DETAILED DESCRIPTION

One or more embodiments are described in a preferred embodiment in the following description with reference to the Figures, in which like numbers represent the same or similar elements. While the description is in terms of the best mode for achieving one or more objectives, it will be appreciated by those skilled in the art that variations may be accomplished in view of those teachings without deviating from the spirit or scope of the described embodiments.

Figure 1:
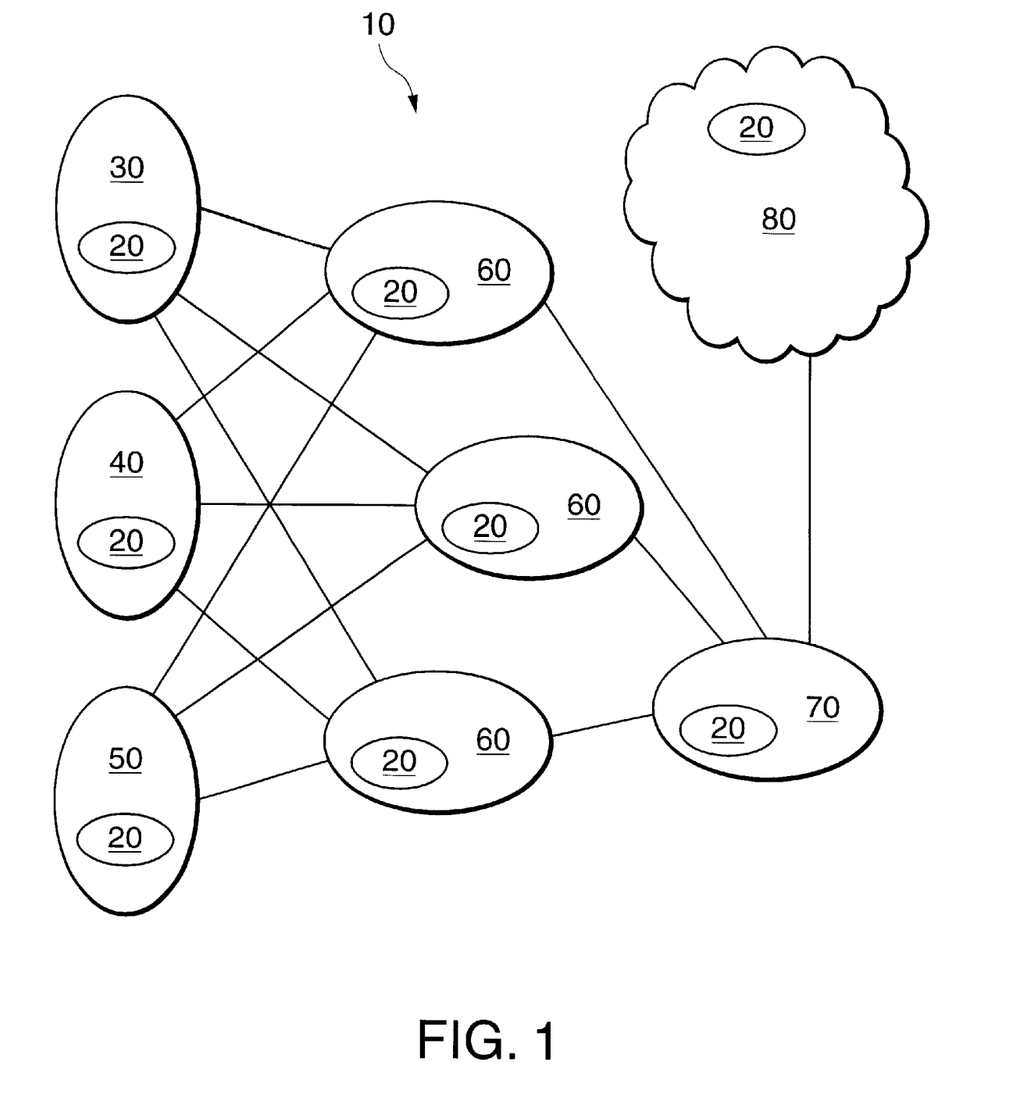
FIG. 1 is a diagram of an exemplary network comprised of data devices that incorporate a cyclic redundancy code machine.

FIG. 1 shows one example of a network. In the network 10 having many nodes, some nodes include a CRC machine 20. The nodes include a computer 30, storage 40, input/output system 50, switches 60, and a router 70. The router 70 couples the network 10 to another network 80, such as the Internet. To verify the integrity of data communicated between the nodes of the network 10, a CRC can be generated at a sending node and included with the data communication. At a receiving node, another CRC can be generated to check whether the data communication is error-free.

In another embodiment, data communication within the computer 30, storage 40, input/output system 50, switch 60, and/or router 70 utilizes the CRC machine 20. For example, within the computer 30, the CRC machine 20 may be positioned with a processor, a memory, storage, and/or other peripherals. Within the storage 40, the CRC machine 20 may be positioned with a processor, memory, and/or a storage array, such as RAID. Within the input/output system 50, the CRC machine 20 may be positioned with various input/output modules for communicating with SCSI devices, over Ethernet, over Fibre Channel, for graphics, Asynchronous Transfer Mode, and/or for video. In one embodiment, an adapter including a CRC machine helps to adapt data between different protocols, such as between InfiniBand and Internet Protocol. The adapter including the CRC machine 20 may be added to the computer 30, storage 40, input/output system 50, switch 60, and/or router 70.

Other embodiments including the CRC machine 20 are modems, network interface cards, cell phones, devices following the Bluetooth Specification 1.0, personal digital assistants, hubs, gateways, etc. Any data device, or device receiving and/or sending data, may include the CRC machine 20 to check whether the data communication is error-free.

Figure 2:
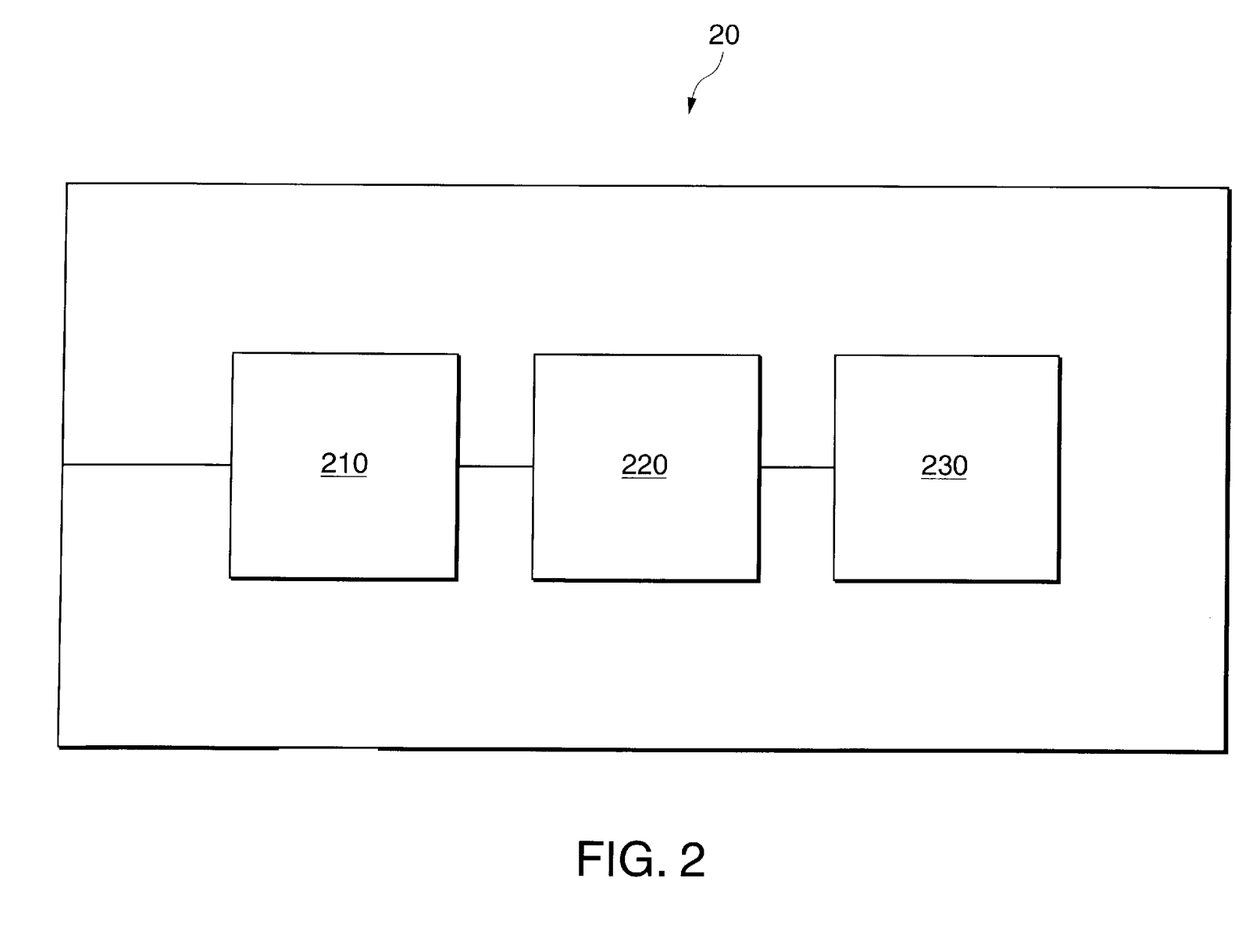
FIG. 2 is a diagram of the cyclic redundancy code machine of FIG. 1, including a demultiplexer and a cyclic redundancy code generator.

FIG. 2 shows an embodiment of the CRC machine 20. The CRC machine 20 includes a data port 210, a demultiplexer 220, and a CRC generator 230. The data port 210 receives data sent to the CRC machine 20 and/or transmits data sent from the CRC machine 20. The demultiplexer 220 splits the received data stream into multiple data streams. The number of multiple data streams may be adjusted for a particular design. In one embodiment, the demultiplexer divides an incoming data stream into eight data streams. The multiple data streams are then transferred to the CRC generator 230. Various embodiments of the CRC machine position the data port 210, the demultiplexer 220, and the CRC generator 230 together in a single integrated circuit, and/or separated in distinct circuits.

Figure 3:
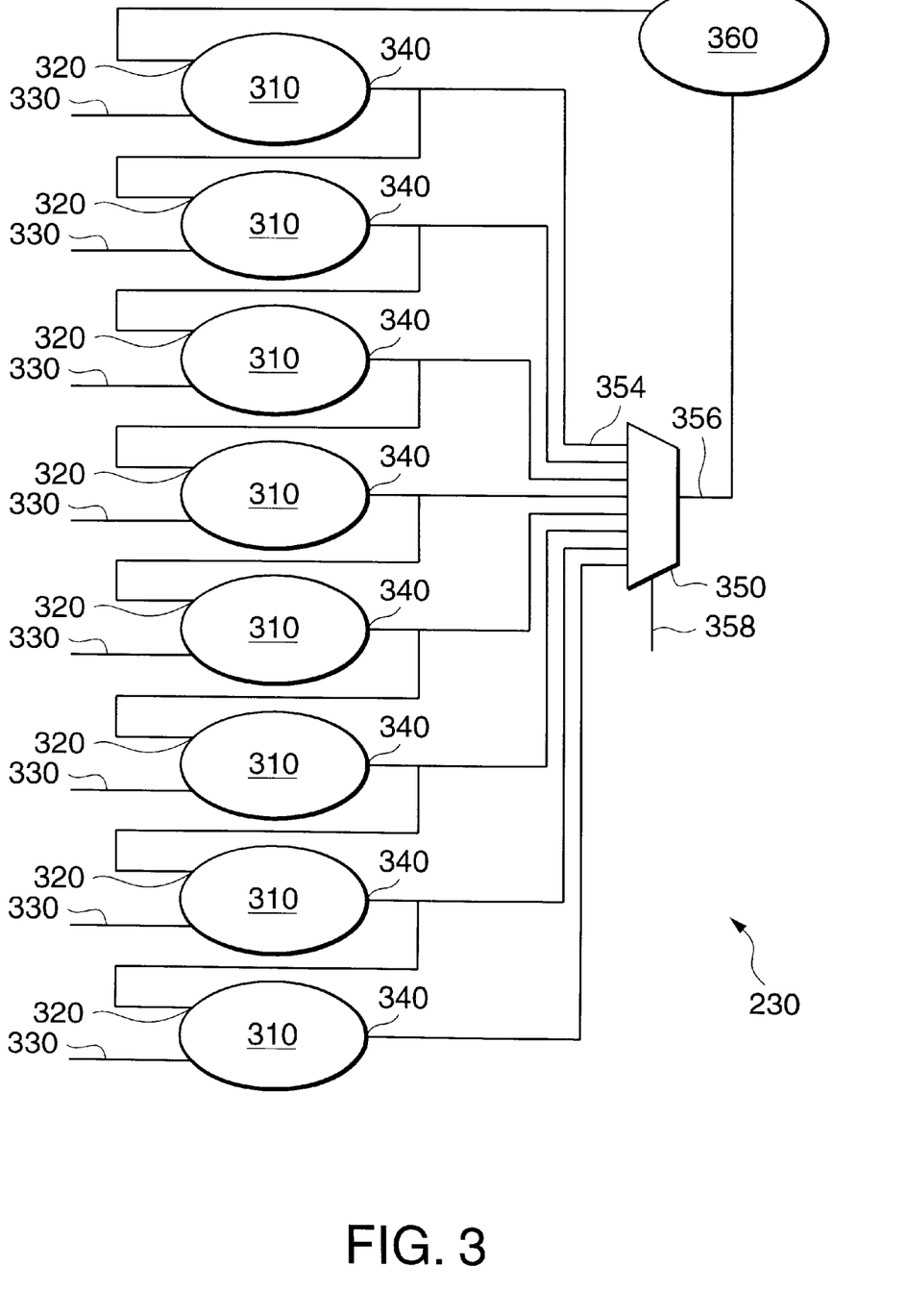
FIG. 3 is a diagram of the cyclic redundancy code generator of FIG. 2 including multiple cyclic redundancy code circuits.

FIG. 3 shows an embodiment of the CRC generator 230. The CRC generator 230 may be applied to both the generation of a CRC for an outgoing message, and for checking the error-free status of a an incoming message. In one embodiment, the generated CRC is combined with an outgoing message. In another embodiment, the value of the generated CRC is checked for an indication of the error-free status of an incoming message.

The CRC generator 230 includes multiple CRC circuits 310, a selector 350, and a state machine 360. The number of multiple CRC circuits can be adjusted, and may match the number of multiple data streams sent from the demultiplexer 220 to the CRC generator 230. Each CRC circuit 310 includes a data input 330, a CRC input 320, and a CRC output 340. The data input 330 receives part of a message, or one of the multiple data streams sent from the demultiplexer 220 to the CRC generator 230. The CRC circuits are coupled together such that for at least some of the CRC circuits 310, the CRC output 340 for a previous CRC circuit 310 is coupled to the CRC input for a next CRC circuit 310.

One or more of the CRC circuits 310 may be initialized prior to calculating a CRC for a message, or data stream. The initialized CRC circuit 310 receives one of the multiple data streams from its data input 330, and generates an intermediate CRC, and sends out the intermediate CRC from the CRC output 340. The intermediate CRC is sent to the CRC input 320 of the next CRC circuit 310. The next CRC circuit 310 receives the intermediate CRC from its CRC input 320. The next CRC circuit 310 also receives another of the multiple data streams from its data input 330. From these two inputs, the next CRC circuit 310 generates another intermediate CRC, which is sent out from the CRC output 340.

Until the last of the CRC circuits 310 generates an intermediate CRC, and/or until the data stream ends, the process iterates—a new intermediate CRC is generated in the next CRC circuit 310 from both the additional message data sent to the next CRC circuit 310 and the previous intermediate CRC generated by the previous CRC circuit 310. If the last of the coupled CRC circuits 310 is reached, and the data stream has still not ended, the intermediate CRC generated by the last of the coupled CRC circuits 310 is fed back to the first of the coupled CRC circuits 310. In one embodiment, this intermediate CRC is fed by way of the selector 350 and the state machine 360. In other embodiments, this intermediate CRC may bypass one or both of the state machine 360 and the selector 350 before feeding into the CRC input 320 of the first CRC circuit 310.

When the data stream ends, the last of the message may have been entered into any one of the message inputs 330. The CRC circuit receiving the last of the message may not be known in advance. The selector 350 includes a selector input 358 to distinguish which of the CRC outputs 340 sending an intermediate CRC is sending out the intermediate CRC generated with the last of the message. One embodiment generates selector data from a control signal accompanying each of the message inputs 330. The control signals accompanying message inputs 330 with valid data can have a first value, and the control signals accompanying message inputs 330 without valid data can have a second value. Alternatively, the message input 330 carrying the last valid data can have a specific value. This intermediate CRC is the CRC for the entire message, and is forwarded to the state machine 360. Thus, if the amount of data sent into each message input 330 and the length of the entire message are such that the final CRC for the entire message may not be generated from the last of the coupled CRC circuits 310, the CRC generator 230 has the flexibility to accurately choose which intermediate CRC is the final CRC. For example, the end of an Ethernet packet may occur at any of the CRC circuits 310. In another embodiment, the message is padded with additional data to force the final CRC to be generated from a particular CRC circuit 310.

In one embodiment, there are 8 CRC circuits 310, and each data input 330 of a CRC circuit 310 can receive one byte at a time. In this embodiment, the coupled CRC circuits 310 collectively process up to 8 bytes, or 64 bits, of the message, in a clock cycle. This configuration can be used by environments such as 10 Gigabit Ethernet, which handle 64 bits at a time. Other embodiments can receive a different amount of information at the data input 330 of the CRC circuit 310, and include a different number of CRC circuits 310. In one further example, an InfiniBand application can include 12 CRC circuits 310, to collectively process up to 12 bytes in a clock cycle.

In one embodiment, the CRC circuits 310 are based on a 32 bit cyclic redundancy code generating equation. The CRC output 340 and the CRC inputs 320 carry 32 bits. Other embodiments can use different equations having a different number of bits, along with different widths of the CRC output 340 and the CRC input 320. For example, CRC circuits based on a 64 bit CRC generating equation or a 32 bit CRC generating equation may be coupled together.

The state machine 360 may includes initialization logic at the start of CRC generation, logic to hold a final CRC generated for a message, and/or comparison logic to check whether the CRC for a received message includes one or more errors.

Figure 4:
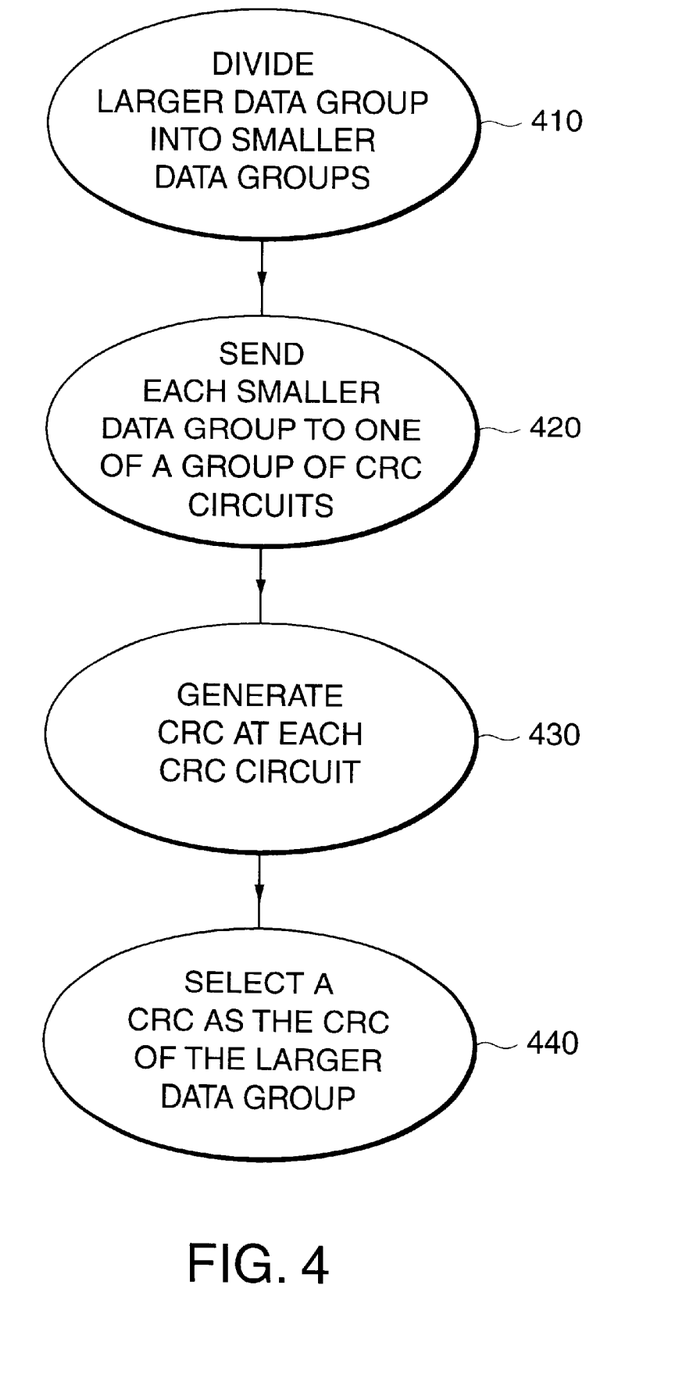
FIG. 4 is a flow diagram for generating a cyclic redundancy code by dividing message data into smaller groups of data to be processed by multiple cyclic redundancy code circuits.
Figure 5:
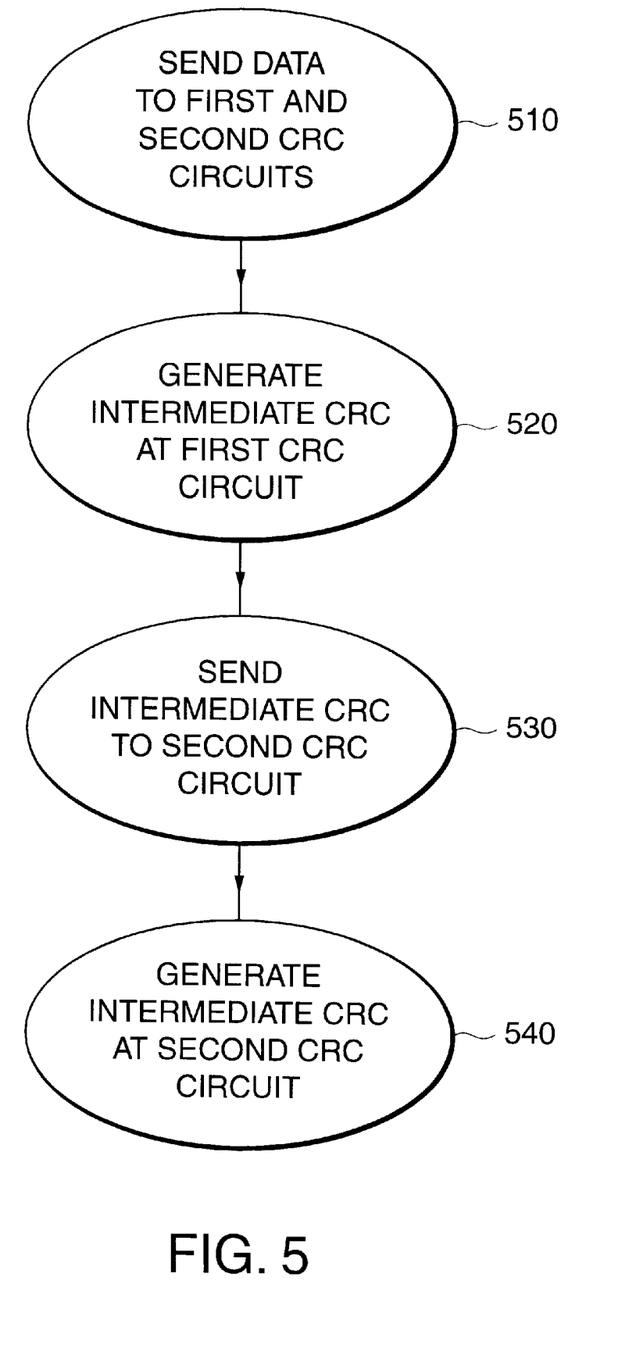
FIG. 5 is a flow diagram for generating a cyclic redundancy code by generating intermediate cyclic redundancy codes.
Figure 6:
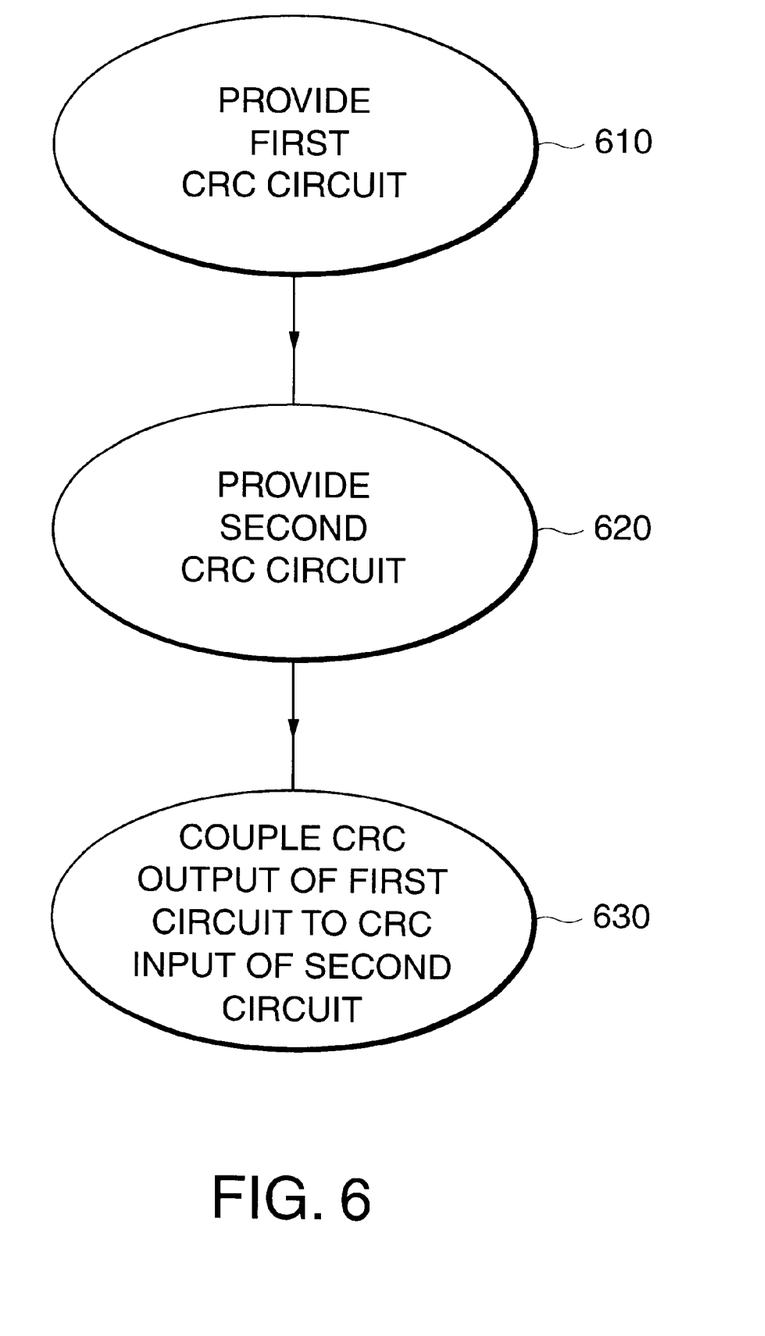
FIG. 6 is a flow diagram of assembling a cyclic redundancy code generator.

FIG. 4, FIG. 5, and FIG. 6 show exemplary flow diagrams of some possible methods of generating a CRC and assembling a CRC code generator. Elements of the flow diagrams may be removed, rearranged, added to, and/or modified.

FIG. 4 shows an exemplary method for generating a CRC with multiple CRC circuits. A CRC circuit can generate an intermediate CRC and/or a final CRC from a previously generated intermediate CRC and/or some message input data. At 410, a incoming data stream, or message, is divided into smaller groups of streams or messages. In 420, each of the smaller groups is sent to one of a group of CRC circuits. In 430, each of the CRC circuits generates an intermediate CRC. In 440, one of the intermediate CRCs is selected as the final CRC of the entire message. The final CRC may be the intermediate CRC circuit generated by the CRC circuit receiving the end of the message for which the CRC is generated.

FIG. 5 shows an exemplary method of generating a CRC, highlighting the interaction between different CRC circuits 310 in the group of coupled CRC circuits 310. This exemplary method discusses two CRC circuits, and other embodiments may include more CRC circuits. In 510, a first part of message data is sent to a first CRC circuit and a second part of message data is sent to a second CRC circuit. In 520, the first CRC generates an intermediate CRC from the first part of message data. In 530, the intermediate CRC is sent from the first CRC circuit to the second CRC circuit. In 540, using the intermediate CRC sent from the first CRC circuit, and the second part message data, the second CRC circuit generates another intermediate CRC.

FIG. 6 shows the assembly of a basic CRC generator. In 610, a first CRC circuit is provided. In 620, a second CRC circuit is provided. In 630, a CRC output of the first CRC circuit is coupled to the CRC input of the second CRC circuit. The CRC circuits may be located on the same or different integrated circuits While the preferred embodiments of the present invention have been illustrated herein in detail, it should be apparent that modifications and adaptations to those embodiments may occur to those skilled in the art without departing from the scope of the following claims. For example, in circuit design, design tools are commonly used to remove and/or rearrange gates, such as by collapsing redundancies, or performing reductions, such as with De Morgan's Laws. Cyclic redundancy code circuits include cyclic redundancy code circuits before and after such modifications.

What is claimed is:

1. An apparatus for generating a cyclic redundancy code, said apparatus comprising:
   a plurality of cyclic redundancy code circuits, each configured to generate and provide a respective cyclic redundancy code at an output in response to receiving in parallel, a first plurality of bits corresponding to a respective portion of a message at a first input and in response to receiving a second plurality of bits corresponding to an input cyclic redundancy code at a second input;
   wherein said output of a given one of a portion of said plurality of cyclic redundancy code circuits is coupled to said first input of a next one of said plurality of cyclic redundancy code circuits; and
   a selector coupled to selectively output one of said respective cyclic redundancy codes dependent upon which of said respective cyclic redundancy codes corresponds to a last respective portion of said message.

2. The apparatus as recited in claim 1, wherein said output of a given one of another portion of said plurality of cyclic redundancy code circuits is coupled to said selector.

3. The apparatus as recited in claim 1, wherein said input cyclic redundancy code of said given one of said portion of said plurality of cyclic redundancy code circuits corresponds to a plurality of bits of a cyclic redundancy code generator polynomial.

4. The apparatus as recited in claim 1 further comprising state logic coupled between said selector output and said given one of said portion of said plurality of cyclic redundancy code circuits and configured to provide said a plurality of bits of said cyclic redundancy code generator polynomial.

5. The apparatus as recited in claim 4, wherein said respective cyclic redundancy code corresponding to said last respective portion of said message is a cyclic redundancy code corresponding to all portions of said message.

6. The apparatus as recited in claim 5, wherein said state logic is further configured to store said respective cyclic redundancy code corresponding to said last respective portion of said message.

7. The apparatus as recited in claim 1, wherein said respective cyclic redundancy code includes a first number of bits that is based upon said message having a second number of bits that is larger than said first number of bits.

8. The apparatus as recited in claim 7, wherein each respective portion of said message includes a third number of bits that is smaller than said first number of bits and said second number of bits.

9. A system for generating a cyclic redundancy code, said system comprising:
   a demultiplexer configured to receive, in parallel, a message including a first plurality of bits and to output, in parallel, a plurality of subsets of said first plurality of bits, wherein each of said plurality of subsets of bits corresponds to a respective portion of said message, and wherein said plurality of subsets of bits includes a last subset of bits corresponding to a last portion of said message; and
   a cyclic redundancy code generator including:
      a plurality of cyclic redundancy code circuits, each configured to generate and provide a respective cyclic redundancy code at an output in response to receiving a respective one of said plurality of subsets at a first input and in response to receiving, in parallel, a second plurality of bits corresponding to an input cyclic redundancy code at a second input;
      wherein said output of a given one of a portion of said plurality of cyclic redundancy code circuits is coupled to said first input of a next one of said plurality of cyclic redundancy code circuits; and
      a selector coupled to selectively output one of said respective cyclic redundancy codes dependent upon which of said respective cyclic redundancy codes corresponds to said last respective portion of said message.

10. The system as recited in claim 9, wherein said output of a given one of another portion of said plurality of cyclic redundancy code circuits is coupled to said selector.

11. The system as recited in claim 9, wherein said input cyclic redundancy code of said given one of said portion of said plurality of cyclic redundancy code circuits corresponds to a plurality of bits of a cyclic redundancy code generator polynomial.

12. The system as recited in claim 9, wherein said cyclic redundancy code generator further comprising state logic coupled between said selector output and said given one of said portion of said plurality of cyclic redundancy code circuits and configured to provide said a plurality of bits of said cyclic redundancy code generator polynomial.

13. The system as recited in claim 12, wherein said respective cyclic redundancy code corresponding to said last respective portion of said message is a cyclic redundancy code corresponding to all portions of said message.

14. The system as recited in claim 13, wherein said state logic is further configured to store said respective cyclic redundancy code corresponding to said last respective portion of said message.

15. The system as recited in claim 9, wherein said respective cyclic redundancy code includes a first number of bits that is based upon said message having a second number of bits that is larger than said first number of bits.

16. The system as recited in claim 15, wherein each respective portion of said message includes a third number of bits that is smaller than said first number of bits and said second number of bits.

17. A method for generating a cyclic redundancy code, said method comprising:

receiving, in parallel, a message including a first plurality of bits;

outputting, in parallel, a plurality of subsets of said first plurality of bits, wherein each of said plurality of subsets of bits corresponds to a respective portion of said message, and wherein said plurality of subsets of bits includes a last subset of bits corresponding to a last portion of said message;

a plurality of cyclic redundancy code circuits, each generating and providing a respective cyclic redundancy code at an output in response to receiving a respective one of said plurality of subsets at a first input and in response to receiving, in parallel, a second plurality of bits corresponding to an input cyclic redundancy code at a second input;

coupling said output of a given one of a portion of said plurality of cyclic redundancy code circuits to said first input of a next one of said plurality of cyclic redundancy code circuits;

selectively outputting one of said respective cyclic redundancy codes dependent upon which of said respective cyclic redundancy codes corresponds to said last respective portion of said message.

18. A system for generating a cyclic redundancy code, said system comprising:

means for receiving, in parallel, a message including a first plurality of bits;

means for outputting, in parallel, a plurality of subsets of said first plurality of bits, wherein each of said plurality of subsets of bits corresponds to a respective portion of said message, and wherein said plurality of subsets of bits includes a last subset of bits corresponding to a last portion of said message;

a plurality of cyclic redundancy code circuits, each generating and providing a respective cyclic redundancy code at an output in response to receiving a respective one of said plurality of subsets at a first input and in response to receiving, in parallel, a second plurality of bits corresponding to an input cyclic redundancy code at a second input;

means for coupling said output of a given one of a portion of said plurality of cyclic redundancy code circuits to said first input of a next one of said plurality of cyclic redundancy code circuits;

means for selectively outputting one of said respective cyclic redundancy codes dependent upon which of said respective cyclic redundancy codes corresponds to said last respective portion of said message.

* * * * *